US008366975B2

(12) United States Patent
Johnson et al.

(10) Patent No.: US 8,366,975 B2
(45) Date of Patent: Feb. 5, 2013

(54) ATYPICAL KESTERITE COMPOSITIONS

(75) Inventors: Lynda Kaye Johnson, Wilmington, DE (US); H. David Rosenfeld, Drumore, PA (US); Daniela Rodica Radu, West Grove, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 379 days.

(21) Appl. No.: 12/784,799

(22) Filed: May 21, 2010

(65) Prior Publication Data

US 2011/0287573 A1 Nov. 24, 2011

(51) Int. Cl.
*H01B 1/08* (2006.01)
*C01B 19/00* (2006.01)
*C01G 19/00* (2006.01)
*C09D 11/00* (2006.01)
*C23C 18/12* (2006.01)

(52) U.S. Cl. .................. 252/519.51; 252/520.1

(58) Field of Classification Search .............. 252/519.4, 252/519.51, 520.1; 423/508
See application file for complete search history.

(56) References Cited

U.S. PATENT DOCUMENTS

| 2011/0094557 A1* | 4/2011 | Mitzi et al. ............ 136/244 |
| 2012/0055554 A1* | 3/2012 | Radu et al. ............ 136/264 |

OTHER PUBLICATIONS

Seol et al "Electrical and optical properties of Cu2ZnSnS4 thin films . . . ", Solar Energy Materials & Solar Cells 75 (2003) 155-162.*
Guo, Qijie et al., Snythesis of Cu2ZnSnS4 Nanocrystal Ink and Its Use for Solar Cells, Journal of American Chemical Society, Jul. 31, 2009, pp. 11672-11673, vol. 131, No. 33, American Chemical Society.
Todorov, T. et al., Cu2ZnSnS4 films deposited by a soft-chemistry method, Thin Solid Films, Feb. 2, 2009, pp. 2541-2544, vol. 517, No. 7, Elsevier B.V.
Kumar, Y. B. Kishore et al., Effect of copper salt and thiourea concentrations on the formation of Cu2ZnSnS4 thin films by spray pyrolysis, Physica Status Solidi A, Jan. 7, 2010, pp. 149-156, vol. 207, No. 1, Wiley-VCH Verlag GmbH & Co.
International Search Report dated Aug. 31, 2011, International Application No. PCT/US2011/037265.

* cited by examiner

*Primary Examiner* — Mark Kopec

(57) ABSTRACT

This invention relates to processes for making kesterite compositions with atypical Cu:Zn:Sn:S ratios and/or kesterite compositions with unusually small coherent domain sizes. This invention also relates to these kesterite compositions and their use in preparing CZTS films.

7 Claims, No Drawings

ATYPICAL KESTERITE COMPOSITIONS

FIELD OF THE INVENTION

This invention relates to processes for making kesterite compositions with atypical Cu:Zn:Sn:S ratios and/or kesterite compositions with unusually small coherent domain sizes. This invention also relates to these kesterite compositions and their use in preparing CZTS films.

BACKGROUND

Crystalline multinary-metal chalcogenide compositions containing only non-toxic and abundant elements are of particular interest in developing environmentally sustainable processes and devices. Copper tin sulfide ($Cu_2SnS_3$ or "CTS") and copper zinc tin sulfide ($Cu_2ZnSnS_4$ or "CZTS") are particularly useful examples of this class of materials, and are of interest due to their potential applications as small band-gap semiconductors, as nonlinear materials, and as suitable candidates for photovoltaic cell materials.

Thin-film photovoltaic cells typically use semiconductors such as CdTe or copper indium gallium sulfide/selenide (CIGS) as an energy absorber material. Due to toxicity of cadmium and the limited availability of indium, alternatives are sought. CZTS possesses a band gap energy of about 1.5 eV and a large absorption coefficient (approx. $10^4$ $cm^{-1}$), making it a promising CIGS replacement.

Challenges in making CZTS thin-films are illustrative of the general challenges that must be surmounted in making films of crystalline multinary-metal chalcogenide compositions. Current techniques to make CZTS thin films (e.g., thermal evaporation, sputtering, hybrid sputtering, pulsed laser deposition and electron beam evaporation) require complicated equipment and therefore tend to be expensive. Electrochemical deposition is an inexpensive process, but compositional non-uniformity and/or the presence of secondary phases prevents this method from generating high-quality CZTS thin-films. CZTS thin-films can also be made by the spray pyrolysis of a solution containing metal salts, typically $CuCl$, $ZnCl_2$, and $SnCl_4$, using thiourea as the sulfur source. This method tends to yield films of poor morphology, density and grain size. Photochemical deposition has also been shown to generate p-type CZTS thin films. However, the composition of the product is not well-controlled, and it is difficult to avoid the formation of impurities such as hydroxides. The synthesis of CZTS nanoparticles, which incorporate high-boiling amines as capping agents, has also been disclosed. The presence of capping agents in the nanoparticle layer may contaminate and lower the density of the annealed CZTS film.

A hybrid solution-particle approach to CZTS involving the preparation of a hydrazine-based slurry comprising dissolved Cu—Sn chalcogenides (S or S—Se), Zn-chalcogenide particles, and excess chalcogen has been reported. However, hydrazine is a highly reactive and potentially explosive solvent that is described in the Merck Index as a "violent poison."

Hence, there still exists a need for simple, low-cost, scalable materials and processes with a low number of operations that provide high-quality, crystalline CTS and CZTS films with tunable composition and morphology. There also exists a need for low-temperature routes to these materials using solvents and reagents with relatively low toxicity.

SUMMARY

One aspect of this invention is a composition comprising a compound having a kesterite structure, wherein the Cu/Zn ratio of the kesterite is greater than about 3.1.

One aspect of this invention is a composition comprising a compound having a kesterite structure, wherein the Cu/Zn ratio of the kesterite is less than about 1.6.

One aspect of this invention is a composition comprising a compound having a kesterite structure, wherein the coherent domain size of the kesterite is 2-30 nm.

Another aspect of this invention is a process comprising:
a) preparing an ink comprising:
   i) a copper source selected from the group consisting of copper complexes of nitrogen-, oxygen-, sulfur-, and selenium-based organic ligands, and mixtures thereof;
   ii) a tin source selected from the group consisting of tin complexes of nitrogen-, oxygen-, carbon-, sulfur-, and selenium-based organic ligands, tin hydrides, tin sulfides, tin selenides, and mixtures thereof;
   iii) a zinc source selected from the group consisting of zinc complexes of nitrogen-, oxygen-, sulfur-, and selenium-based organic ligands, and mixtures thereof;
   iv) an elemental chalcogen selected from the group consisting of: elemental S, elemental selenium, and mixtures thereof;
   v) a solvent;
   iv) optionally, a chalcogen compound selected from the group consisting of: $R^1S$—Z, $R^1Se$—Z and mixtures thereof, with each Z independently selected from the group consisting of: H and $SiR^5{}_3$; wherein each $R^1$ and $R^5$ is independently selected from the group consisting of: hydrocarbyl and O—, N—, S—, halogen-, and tri(hydrocarbyl)silyl-substituted hydrocarbyl;
b) heating the ink to a temperature of 150-300° C.;
b) disposing the ink onto a substrate; and
c) heating the substrate and ink disposed thereon to a temperature of 80-350° C. to form a coated substrate comprising CZTS-Se kesterite.

DETAILED DESCRIPTION

Herein, the terms "solar cell" and "photovoltaic cell" are synonymous unless specifically defined otherwise. These terms refer to devices that use semiconductors to convert visible and near-visible light energy into usable electrical energy. The terms "band gap energy", "optical band gap", and "band gap" are synonymous unless specifically defined otherwise. These terms refer to the energy required to generate electron-hole pairs in a semiconductor material, which in general is the minimum energy needed to excite an electron from the valence band to the conduction band.

Herein, element groups are represented utilizing CAS notation. As used herein, the term "chalcogen" refers to Group VIA elements, and the terms "metal chalcogenides" or "chalcogenides" refer to materials that comprise metals and Group VIA elements. Suitable Group VIA elements include sulfur, selenium and tellurium. Metal chalcogenides are important candidate materials for photovoltaic applications, since many of these compounds have optical band gap values well within the terrestrial solar spectra.

Herein, the term "binary-metal chalcogenide" refers to a chalcogenide composition comprising one metal. The term "ternary-metal chalcogenide" refers to a chalcogenide composition comprising two metals. The term "quaternary-metal chalcogenide" refers to a chalcogenide composition comprising three metals. The term "multinary-metal chalcogenide" refers to a chalcogenide composition comprising two or more metals and encompasses ternary and quaternary metal chalcogenide compositions.

Herein, the terms "copper tin sulfide" and "CTS" refer to $Cu_2SnS_3$; "copper tin selenide" and "CTSe" refer to Cu$_2$SnSe$_3$; and "copper tin sulfide/selenide" and "CTS-Se" encompass all possible combinations of Cu$_2$Sn(S,Se)$_3$, including Cu$_2$SnS$_3$, Cu$_2$SnSe$_3$, and Cu$_2$SnS$_x$Se$_{3-x}$, where $0 \leq x \leq 3$. The terms "copper tin sulfide", "copper tin selenide", "copper tin sulfide/selenide", "CTS", "CTSe" and "CTS-Se" further encompass fractional stoichiometries, e.g., Cu$_{1.80}$Sn$_{1.05}$S$_3$. That is, the stoichiometry of the elements can vary from a strictly 2:1:3 molar ratio.

Herein, the terms copper zinc tin sulfide and "CZTS" refer to Cu$_2$ZnSnS$_4$; copper zinc tin selenide and "CZTSe" refer to Cu$_2$ZnSnSe$_4$; and copper zinc tin sulfide/selenide and "CZTS-Se" encompass all possible combinations of Cu$_2$ZnSn(S,Se)$_4$, including Cu$_2$ZnSnS$_4$, Cu$_2$ZnSnSe$_4$, and Cu$_2$ZnSnS$_x$Se$_{4-x}$, where $0 \leq x \leq 4$. The terms "CZTS," "CZTSe," and "CZTS-Se" further encompass copper zinc tin sulfide/selenide semiconductors with fractional stoichiometries, e.g., Cu$_{1.94}$Zn$_{0.63}$Sn$_{1.3}$S$_4$. That is, the stoichiometry of the elements can vary from a strictly 2:1:1:4 molar ratio. Materials designated as CTS-Se and CZTS-Se may also contain small amounts of other elements such as sodium. To date, the highest efficiencies have been measured for copper-poor CZTS-Se solar cells, where by "copper-poor" it is understood that the ratio Cu/(Zn+Sn) is less than 1.0. For high efficiency devices, a molar ratio of zinc to tin is greater than one is also desirable.

The term "kesterite" is commonly used to refer to materials belonging to the kesterite family of minerals and is also the common name of the mineral CZTS. As used herein, the term "kesterite" refers to crystalline compounds in either the I4- or I4-2m space groups having the nominal formula Cu$_2$ZnSn(S—Se)$_4$, and also "atypical kesterites" wherein zinc has replaced a fraction of the copper or copper has replaced a fraction of the zinc to give Cu$_c$Zn$_z$Sn(S—Se)$_4$ wherein c is greater than two and z is less than one; or c is less than two and z is greater than one. The term "kesterite structure" refers to the structure of these compounds. X-ray absorption spectroscopy (XAS) reveals spectral features unique to the kesterite form and allows for determination of the ratio of Cu to Zn in the kesterite phase. This allows for the identification of atypical kesterite compositions, which are clearly distinguished from a mixture of separate sulfide phases producing the same elemental ratios in aggregate. Control of stoichiometry in this phase allows for control of electronic properties for improved performance in a photovoltaic device.

As used herein, "coherent domain size" refers to the size of crystalline domains over which a defect-free, coherent structure may exist. The coherency comes from the fact that the three-dimensional ordering is not broken inside of these domains.

Herein, the term "metal salts" refers to compositions wherein metal cations and inorganic anions are joined by ionic bonding. Relevant classes of inorganic anions comprise oxides, sulfides, carbonates, sulfates and halides. Herein, the term "metal complexes" refers to compositions wherein a metal is bonded to a surrounding array of molecules or anions, typically called "ligands" or "complexing agents". The atom within a ligand that is directly bonded to the metal atom or ion is called the "donor atom" and, herein, often comprises nitrogen, oxygen, selenium, or sulfur.

Herein, ligands are classified according to the "Covalent Bond Classification (CBC) Method" (Green, M. L. H. *J. Organomet. Chem.* 1995, 500, 127-148). An "X-function ligand" is one which interacts with a metal center via a normal 2-electron covalent bond, composed of 1 electron from the metal and 1 electron from the X ligand. Simple examples of X-type ligands include alkyls and thiolates. Herein, the term "nitrogen-, oxygen-, carbon-, sulfur-, and selenium-based organic ligands" refers specifically to carbon-containing X-function ligands, wherein the donor atom comprises nitrogen, oxygen, carbon, sulfur, or selenium. Herein, the term "complexes of nitrogen-, oxygen-, carbon-, sulfur-, and selenium-based organic ligands" refers to the metal complexes comprising these ligands. Examples include metal complexes of amidos, alkoxides, acetylacetonates, acetates, carboxylates, hydrocarbyls, O-, N-, S-, Se-, and halogen-substituted hydrocarbyls, thiolates, selenolates, thiocarboxylates, selenocarboxylates, dithiocarbamates, and diselenocarbamates.

As defined herein, a "hydrocarbyl group" is a univalent group containing only carbon and hydrogen. Examples of hydrocarbyl groups include unsubstituted alkyls, cycloalkyls, and aryl groups, including alkyl-substituted aryl groups. Suitable hydrocarbyl groups and alkyl groups contain 1 to about 30 carbons, or 1 to 25, 1 to 20, 1 to 15, 1 to 10, 1 to 5, 1 to 4, or 1 to 2 carbons. By "heteroatom-substituted hydrocarbyl" is meant a hydrocarbyl group that contains one or more heteroatoms wherein the free valence is located on carbon, not on the heteroatom. Examples include hydroxyethyl and carbomethoxyethyl. Suitable heteroatom substituents include O-, N-, S-, halogen, and tri(hydrocarbyl)silyl. In a substituted hydrocarbyl, all of the hydrogens may be substituted, as in trifluoromethyl. Herein, the term "tri(hydrocarbyl)silyl" encompasses silyl substituents, wherein the substituents on silicon are hydrocarbyls. Herein, by "O-, N-, S-, and Se-based functional groups" is meant univalent groups other than hydrocarbyl and substituted hydrocarbyl that comprise O-, N-, S-, or Se-heteroatoms, wherein the free valence is located on this heteroatom. Examples of O-, N-, S-, and Se-based functional groups include alkoxides, amidos, thiolates, and selenolates.

Process for Forming Atypical Kesterites

One aspect of this invention is a process to form kesterite with atypical Cu/Zn ratios and/or small coherent domains.

The process comprises:

a) preparing an ink comprising:

i) a copper source selected from the group consisting of copper complexes of nitrogen-, oxygen-, sulfur-, and selenium-based organic ligands, and mixtures thereof;

ii) a tin source selected from the group consisting of tin complexes of nitrogen-, oxygen-, carbon-, sulfur-, and selenium-based organic ligands, tin hydrides, tin sulfides, tin selenides, and mixtures thereof;

iii) a zinc source selected from the group consisting of zinc complexes of nitrogen-, oxygen-, sulfur-, and selenium-based organic ligands, and mixtures thereof;

iv) an elemental chalcogen selected from the group consisting of: elemental S, elemental selenium, and mixtures thereof;

v) a solvent;

iv) optionally, a chalcogen compound selected from the group consisting of: R$^1$S—Z, R$^1$Se—Z and mixtures thereof, with each Z independently selected from the group consisting of: H and SiR$^5$$_3$; wherein each R$^1$ and R$^5$ is independently selected from the group consisting of: hydrocarbyl and O-, N-, S-, halogen-, and tri(hydrocarbyl)silyl-substituted hydrocarbyl;

b) heating the ink to a temperature of 150-300° C.;

c) disposing the ink onto a substrate; and c) heating the substrate and ink disposed thereon to a temperature of 80-350° C. to form a coated substrate comprising CZTS-Se kesterite.

In some embodiments, the ratio of the total number of moles of elemental chalcogen, sulfur- and selenium-based organic ligands, and tin-sulfides and selenides to the total number of moles of the copper, tin and zinc complexes is at least about 1. In some embodiments, a chalcogen compound is present. In some embodiments, the elemental chalcogen comprises sulfur and the molar ratio of sulfur to tin source is about 0.2 to about 5, or about 0.5 to about 2.5.

In some embodiments, the nitrogen-, oxygen-, carbon-, sulfur-, and selenium-based organic ligands are selected from the group consisting of: amidos; alkoxides; acetylacetonates; carboxylates; hydrocarbyls; O-, N-, S-, halogen- and tri(hydrocarbyl)silyl-substituted hydrocarbyls; thio- and selenolates; thio-, seleno-, and dithiocarboxylates; dithio-, diseleno-, and thioselenocarbamates; and dithioxanthogenates.

Suitable amidos include: bis(trimethylsilyl)amino, dimethylamino, diethylamino, diisopropylamino, N-methyl-t-butylamino, 2-(dimethylamino)-N-methylethylamino, N-methylcyclohexylamino, dicyclohexylamino, N-ethyl-2-methylallylamino, bis(2-methoxyethyl)amino, 2-methylaminomethyl-1,3-dioxolane, pyrrolidino, t-butyl-1-piperazinocarboxylate, N-methylanilino, N-phenylbenzylamino, N-ethyl-o-toluidino, bis(2,2,2-trifluoromethyl)amino, N-t-butyltrimethylsilylamino, and mixtures thereof. Some ligands may chelate the metal center, and, in some cases, comprise more than one type of donor atom, e.g., the dianion of N-benzyl-2-aminoethanol is a suitable ligand comprising both amino and alkoxide groups.

Suitable alkoxides include: methoxide, ethoxide, n-propoxide, i-propoxide, n-butoxide, t-butoxide, neopentoxide, ethylene glycol dialkoxide, 1-methylcyclopentoxide, 2-fluoroethoxide, 2,2,2,-trifluoroethoxide, 2-ethoxyethoxide, 2-methoxyethoxide, 3-methoxy-1-butoxide, methoxyethoxyethoxide, 3,3-diethoxy-1-propoxide, 2-dimethylaminoethoxide, 2-diethylaminoethoxide, 3-dimethylamino-1-propoxide, 3-diethylamino-1-propoxide, 1-dimethylamino-2-propoxide, 1-diethylamino-2-propoxide, 2-(1-pyrrolidinyl)ethoxide, 1-ethyl-3-pyrrolidinoxide, 3-acetyl-1-propoxide, 4-methoxyphenoxide, 4-chlorophenoxide, 4-t-butylphenoxide, 4-cyclopentylphenoxide, 4-ethylphenoxide, 3,5-bis(trifluoromethyl)phenoxide, 3-chloro-5-methoxyphenoxide, 3,5-dimethoxyphenoxide, 2,4,6-trimethylphenoxide, 3,4,5-trimethylphenoxide, 3,4,5-trimethoxyphenoxide, 4-t-butyl-catecholate(2-), 4-propanoylphenoxide, 4-(ethoxycarbonyl)phenoxide, 3-(methylthio)-1-propoxide, 2-(ethylthio)-1-ethoxide, 2-(methylthio)ethoxide, 4-(methylthio)-1-butoxide, 3-(methylthio)-1-hexoxide, 2-methoxybenzylalkoxide, 2-(trimethylsilyl)ethoxide, (trimethylsilyl)methoxide, 1-(trimethylsilyl)ethoxide, 3-(trimethylsilyl)propoxide, 3-methylthio-1-propoxide, and mixtures thereof.

Herein, the term acetylacetonate refers to the anion of 1,3-dicarbonyl compounds, $A^1C(O)CH(A^2)C(O)A^1$, wherein each $A^1$ is independently selected from hydrocarbyl, substituted hydrocarbyl, and O-, S-, and N-based functional groups and each $A^2$ is independently selected from hydrocarbyl, substituted hydrocarbyl, halogen, and O-, S-, and N-based functional groups. Suitable acetylacetonates include: 2,4-pentanedionate, 3-methyl-2-4-pentanedionate, 3-ethyl-2,4-pentanedionate, 3-chloro-2,4-pentanedionate, 1,1,1-trifluoro-2,4-pentanedionate, 1,1,1,5,5,5-hexafluoro-2,4-pentanedionate, 1,1,1,5,5,6,6,6,-octafluoro-2,4-hexanedionate, ethyl 4,4,4-trifluoroacetoacetate, 2-methoxyethylacetoacetate, methylacetoacetate, ethylacetoacetate, t-butylacetoacetate, 1-phenyl-1,3-butanedionate, 2,2,6,6-tetramethyl-3,5-heptaned ionate, allyloxyethoxytrifluoroacetoacetate, 4,4,4-trifluoro-1-phenyl-1,3-butanedionate, 1,3-diphenyl-1,3-propanedionate, 6,6,7,7,8,8,8,-heptafluoro-2,2-dimethyl-3,5-octanedionate, and mixtures thereof.

Suitable carboxylates include: acetate, trifluoroacetate, propionate, butyrates, hexanoate, octanoate, decanoate, stearate, isobutyrate, t-butyl acetate, heptafluorobutyrate, methoxyacetate, ethoxyacetate, methoxypropionate, 2-ethyl hexanoate, 2-(2-methoxyethoxy)acetate, 2-[2-(2-methoxyethoxy)ethoxy]acetate, (methylthio)acetate, tetrahydro-2-furoate, 4-acetyl butyrate, phenylacetate, 3-methoxyphenylacetate, (trimethylsilyl)acetate, 3-(trimethylsilyl)propionate, maleate, benzoate, acetylenedicarboxylate, and mixtures thereof.

Suitable hydrocarbyls include: methyl, ethyl, n-propyl, i-propyl, n-butyl, i-butyl, sec-butyl, t-butyl, n-pentyl, n-hexyl, n-heptyl, n-octyl, neopentyl, 3-methylbutyl, phenyl, benzyl, 4-t-butylbenzyl, 4-t-butylphenyl, p-tolyl, 2-methyl-2-phenylpropyl, 2-mesityl, 2-phenylethyl, 2-ethylhexyl, 2-methyl-2-phenylpropyl, 3,7-dimethyloctyl, allyl, vinyl, cyclopentyl, cyclohexyl, and mixtures thereof.

Suitable O-, N-, S-, halogen- and tri(hydrocarbyl)silyl-substituted hydrocarbyls include: 2-methoxyethyl, 2-ethoxyethyl, 4-methoxyphenyl, 2-methoxybenzyl, 3-methoxy-1-butyl, 1,3-dioxan-2-ylethyl, 3-trifluoromethoxyphenyl, 3,4-(methylenedioxy)phenyl, 2,4-dimethoxyphenyl, 2,5-dimethoxyphenyl, 3,4-dimethoxyphenyl, 2-methoxybenzyl, 3-methoxybenzyl, 4-methoxybenzyl, 3,5-dimethoxyphenyl, 3,5-dimethyl-4-methoxyphenyl, 3,4,5-trimethoxyphenyl, 4-methoxyphenethyl, 3,5-dimethoxybenzyl, 4-(2-tetrahydro-2H-pyranoxy)phenyl, 4-phenoxyphenyl, 2-benzyloxyphenyl, 3-benzyloxyphenyl, 4-benzyloxyphenyl, 3-fluoro-4-methoxyphenyl, 5-fluoro-2-methoxyphenyl, 2-ethoxyethenyl, 1-ethoxyvinyl, 3-methyl-2-butenyl, 2-furyl, carbomethoxyethyl, 3-dimethylamino-1-propyl, 3-diethylamino-1-propyl, 3-[bis(trimethylsilyl)amino]phenyl, 4-(N,N-dimethyl)aniline, [2-(1-pyrrolidinylmethyl)phenyl], [3-(1-pyrrolidinylmethyl)phenyl], [4-(1-pyrrolidinylmethyl)phenyl], [2-(4-morpholinylmethyl)phenyl], [3-(4-morpholinylmethyl)phenyl], [4-(4-morpholinylmethyl)phenyl], (4-(1-piperidinylmethyl)phenyl), (2-(1-piperidinylmethyl)phenyl), (3-(1-piperidinylmethyl)phenyl), 3-(1,4-dioxa-8-azaspiro[4,5]dec-8-ylmethyl)phenyl, 1-methyl-2-pyrrolyl, 2-fluoro-3-pyridyl, 6-methoxy-2-pyrimidyl, 3-pyridyl, 5-bromo-2-pyridyl, 1-methyl-5-imidazolyl, 2-chloro-5-pyrimidyl, 2,6-dichloro-3-pyrazinyl, 2-oxazolyl, 5-pyrimidyl, 2-pyridyl, 2-(ethylthio)ethyl, 2-(methylthio)ethyl, 4-(methylthio)butyl, 3-(methylthio)-1-hexyl, 4-thioanisole, 4-bromo-2-thiazolyl, 2-thiophenyl, chloromethyl, 4-fluorophenyl, 3-fluorophenyl, 4-chlorophenyl, 3-chlorophenyl, 4-fluoro-3-methylphenyl, 4-fluoro-2-methylphenyl, 4-fluoro-3-methylphenyl, 5-fluoro-2-methylphenyl, 3-fluoro-2-methylphenyl, 4-chloro-2-methylphenyl, 3-fluoro-4-methylphenyl, 3,5-bis(trifluoromethyl)-phenyl, 3,4,5-trifluorophenyl, 3-chloro-4-fluorophenyl, 3-chloro-5-fluorophenyl, 4-chloro-3-fluorophenyl, 3,4-dichlorophenyl, 3,5-dichlorophenyl, 3,4-difluorophenyl, 3,5-difluorophenyl, 2-bromobenzyl, 3-bromobenzyl, 4-fluorobenzyl, perfluoroethyl, 2-(trimethylsilyl)ethyl, (trimethylsilyl)methyl, 3-(trimethylsilyl)propyl, and mixtures thereof.

Suitable thio- and selenolates include: 1-thioglycerol, phenylthio, ethylthio, methylthio, n-propylthio, i-propylthio, n-butylthio, i-butylthio, t-butylthio, n-pentylthio, n-hexylthio, n-heptylthio, n-octylthio, n-nonylthio, n-decylthio, n-dodecylthio, 2-methoxyethylthio, 2-ethoxyethylthio, 1,2-ethanedithiolate, 2-pyridinethiolate, 3,5-bis(trifluoromethyl)benzenethiolate, toluene-3,4-dithiolate, 1,2-benzenedithiolate, 2-dimethylaminoethanethiolate, 2-diethylaminoethanethiolate, 2-propene-1-thiolate, 2-hydroxythiolate, 3-hydroxythiolate, methyl-3-mercaptopropionate anion, cyclopentanethiolate, 2-(2-methoxyethoxy)ethanethiolate, 2-(trimethylsilyl)ethanethiolate, pentafluorophenylthiolate, 3,5-dichlorobenzenethiolate, phenylthiolate, cyclohexanethiolate, 4-chlorobenzenemethanethiolate, 4-fluorobenzenemethanethiolate, 2-methoxybenzenethiolate, 4-methoxybenzenethiolate, benzylthiolate, 3-methylbenzylthiolate, 3-ethoxybenzenethiolate, 2,5-dimethoxybenzenethiolate, 2-phenylethanethiolate, 4-t-butylbenzenethiolate, 4-t-butylbenzylthiolate, phenylselenolate, methylselenolate, ethylselenolate, n-propylselenolate, i-propylselenolate, n-butylselenolate, i-butylselenolate, t-butylselenolate, pentylselenolate, hexylselenolate, octylselenolate, benzylselenolate, and mixtures thereof.

Suitable thio-, seleno-, and dithiocarboxylates include: thioacetate, thiobenzoate, selenobenzoate, dithiobenzoate, and mixtures thereof.

Suitable dithio-, diseleno-, and thioselenocarbamates include: dimethyldithiocarbamate, diethyldithiocarbamate, dipropyldithiocarbamate, dibutyldithiocarbamate, bis(hydroxyethyl)dithiocarbamate, dibenzyldithiocarbamate, dimethyldiselenocarbamate, diethyldiselenocarbamate, dipropyldiselenocarbamate, dibutyldiselenocarbamate, dibenzyldiselenocarbamate, and mixtures thereof.

Suitable dithioxanthogenates include: methylxanthogenate, ethylxanthogenate, i-propylxanthogenate, and mixtures thereof.

For the chalcogen compounds, suitable $R^1S-$ and $R^1Se-$ of $R^1S-Z$ and $R^1Se-Z$ are selected from the above list of suitable thio- and selenolates.

Suitable $SiR^5_3$ include: $SiMe_3$, $SiEt_3$, $SiPr_3$, $SiBu_3$, $Si(i-Pr)_3$, $SiEtMe_2$, $SiMe_2(i-Pr)$, $Si(t-Bu)Me_2$, and $Si(cyclohexyl)Me_2$.

Many of these ligands and chalcogen compounds are commercially available or readily synthesized by the addition of an amine, alcohol, or alkyl nucleophile to $CS_2$ or $CSe_2$ or $CSSe$.

In some embodiments, a solvent is present and the boiling point of the solvent is greater than about 100° C. or 110° C. or 120° C. or 130° C. or 140° C. or 150° C. or 160° C. or 170° C. or 180° C. or 190° C. at atmospheric pressure. In some embodiments, the process is conducted at atmospheric pressure. Suitable solvents include: heteroaromatics, amines, and mixtures thereof. Suitable heteroaromatics include pyridine and substituted pyridines. Suitable amines include compounds of the form $R^6NH_2$, wherein each $R^6$ is independently selected from the group consisting of: O-, N-, S-, and Se-substituted hydrocarbyl. In some embodiments, the solvent comprises an amino-substituted pyridine. In some embodiments, the solvent comprises about 95 to about 5 wt %, or 90 to 10 wt %, or 80 to 20 wt %, or 70 to 30 wt %, or 60 to 40 wt % of the ink, based on the total weight of the ink.

Suitable heteroaromatic solvents include: pyridine, 2-picoline, 3-picoline, 3,5-lutidine, 4-t-butylpyridine, 2-aminopyridine, 3-aminopyridine, diethylnicotinamide, 3-cyanopyridine, 3-fluoropyridine, 3-chloropyridine, 2,3-dichloropyridine, 2,5-dichloropyridine, 5,6,7,8-tetrahydroisoquinoline, 6-chloro-2-picoline, 2-methoxypyridine, 3-(aminomethyl)pyridine, 2-amino-3-picoline, 2-amino-6-picoline, 2-amino-2-chloropyridine, 2,3-diaminopyridine, 3,4-diaminopyridine, 2-(methylamino)pyridine, 2-dimethylaminopyridine, 2-(aminomethyl)pyridine, 2-(2-aminoethyl)pyridine, 2-methoxypyridine, 2-butoxypyridine, and mixtures thereof.

Suitable amine solvents include: butylamine, hexylamine, octylamine, 3-methoxypropylamine, 2-methylbutylamine, isoamylamine, 1,2-dimethylpropylamine, hydrazine, ethylenediamine, 1,2-diaminopropane, 1,2-diaminopropane, 1,2-diamino-2-methylpropane, 1,3-diaminopentane, 1,1-dimethylhydrazine, N-ethylmethylamine, diethylamine, N-methylpropylamine, diisopropylamine, dibutylamine, triethylamine, N-methylethylenediamine, N-ethylethylenediamine, N-propylethylenediamine, N-isopropylethylenediamine, N,N'-dimethylethylenediamine, N,N-dimethylethylenediamine, N,N'-diethylethylenediamine, N,N-diethylethylenediamine, N,N-diisopropylethylenediamine, N,N-dibutylethylenediamine, N,N,N'-trimethylethylenediamine, 3-dimethylaminopropylamine, 3-diethylaminopropylamine, diethylenetriamine, cyclohexylamine, bis(2-methoxyethyl)amine, aminoacetaldehyde diethyl acetal, methylaminoacetaldehyde dimethyl acetal, N,N-dimethylacetamide dimethyl acetal, dimethylaminoacetaldehyde diethyl acetal, diethylaminoacetaldehyde diethyl acetal, 4-aminobutyraldehyde diethyl acetal, 2-methylaminomethyl-1,3-dioxolane, ethanolamine, 3-amino-1-propanol, 2-hydroxyethylhydrazine, N,N-diethylhydroxylamine, 4-amino-1-butanol, 2-(2-aminoethoxy)ethanol, 2-(methylamino)ethanol, 2-(ethylamino)ethanol, 2-(propylamino)ethanol, diethanolamine, diisopropanolamine, N,N-dimethylethanolamine, N,N-diethylethanolamine, 2-(dibutylamino)ethanol, 3-dimethylamino-1-propanol, 3-diethylamino-1-propanol, 1-dimethylamino-2-propanol, 1-diethylamino-2-propanol, N-methyldiethanolamine, N-ethyldiethanolamine, 3-amino-1,2-propanediol, and mixtures thereof.

Preparing the ink typically comprises mixing the components (i)-(v) by any conventional method. In some embodiments, the ink is a solution; in other embodiments, the ink is a suspension or dispersion. Typically, the preparation is conducted under an inert atmosphere, taking precautions to protect the reaction mixtures from air and light.

In some embodiments, the ink is prepared at about 20-100° C., e.g., when the reagents are solids or have high boiling points and/or when one or more of the solvents is a solid at room temperature, e.g., 2-aminopyridine or 3-aminopyridine. In some embodiments, all of the ink components are added together at room temperature. In some embodiments, elemental chalcogen is added last, following the mixing of all the other components for about half an hour at room temperature. In some embodiments, the components are added consecutively. For example, all of the reagents except copper can be mixed and heated at about 100° C. prior to addition of the copper source, or all of the reagents except tin can be mixed and heated at about 100° C. prior to the addition of the tin source.

The ink is heated to a temperature of greater than about 15° C.° or 160° C. or 170° C. or 180° C. or 190° C. before coating onto a substrate. Suitable heating methods include conventional heating and micowave heating. In some embodiments, it has been found that this heat-processing step aids the formation of CZT, with XAS analysis of films formed from heat-processed inks indicating the presence of kesterite upon heating the films at heating temperatures as low as 120° C. This heat-processing step is typically carried out under an inert atmosphere. The ink produced at this stage can be stored for extended periods (e.g., a couple of months) without any noticeable decrease in efficacy. In some embodiments, the molar ratio of copper to zinc to tin is about 2:1:1 in the ink.

The substrate can be rigid or flexible. In one embodiment, the substrate comprises in layered sequence: (i) a base film; and (ii) optionally, an electrically conductive coating. The base film is selected from the group consisting of: glass, metals, and polymeric films. Suitable electrically conductive coatings include: metal conductors, transparent conducting oxides, and organic conductors. Of particular interest are substrates of molybdenum-coated soda-lime glass, molybdenum-coated polyimide films, or molybdenum-coated polyimide films with a thin layer of a sodium compound (e.g., NaF, Na$_2$S, or Na$_2$Se). In one embodiment, the substrate comprises material selected from the group consisting of metal foils, plastics, polymers, metalized plastics, glass, solar glass, low-iron glass, green glass, soda-lime glass, steel, stainless steel, aluminum, ceramics, metal plates, metalized ceramic plates, and metalized polymer plates.

The ink is disposed on a substrate to provide a coated substrate by any of a variety of solution-based coating and printing techniques, including spin-coating, spray-coating, dip-coating, rod-coating, drop-cast coating, roller coating, slot-die coating, draw-down coating, ink-jet printing, contact printing, gravure printing, flexographic printing, and screen printing. The coating can be dried by evaporation, by applying vacuum, by heating, or by combinations thereof. In some embodiments, the substrate and disposed ink are heated at a temperature from 80-350° C., or 100-300° C., or 120-250° C., or 150-190° C. to remove at least a portion of the solvent, if present, and by-products derived from the ligands and chalcogen source.

Atypical Kesterite Compositions

Additional aspects of this invention are atypical kesterite compositions produced by the processes of this invention.

One aspect of this invention is a composition comprising a compound having a kesterite structure, wherein the Cu/Zn ratio of the kesterite is greater than about 3.1.

In some embodiments, the composition further comprises one or more copper-, tin-, or zinc-containing compounds selected from the group consisting of binary copper chalcogenides, binary copper oxides, binary tin chalcogenides, binary tin oxides, binary zinc chalcogenides, ZnO, and CTS-Se. In some embodiments, a molar ratio of copper to zinc to tin is about 2:1:1 of the overall composition. In some embodiments, a molar ratio of copper to (zinc plus tin) is less than one, and a molar ratio of zinc to tin is greater than one. In some embodiments, the heated layers comprise CZTS-Se wherein the coherent domain size of the kesterite is 2-30 nm.

One aspect of this invention is a composition comprising a compound having a kesterite structure, wherein the Cu/Zn ratio of the kesterite is less than about 1.6.

In some embodiments, the composition further comprises one or more copper-, tin-, or zinc-containing compounds selected from the group consisting of binary copper chalcogenides, binary copper oxides, binary tin chalcogenides, binary tin oxides, binary zinc chalcogenides, ZnO, and CTS-Se. In some embodiments, a molar ratio of copper to zinc to tin is about 2:1:1 of the overall composition. In some embodiments, a molar ratio of copper to (zinc plus tin) is less than one, and a molar ratio of zinc to tin is greater than one. In some embodiments, the heated layers comprise CZTS-Se wherein the coherent domain size of the kesterite is 2-30 nm.

One aspect of this invention is a composition comprising a compound having a kesterite structure, wherein the coherent domain size of the kesterite is 2-30 nm.

In some embodiments, the composition further comprises one or more copper-, tin-, or zinc-containing compounds selected from the group consisting of binary copper chalcogenides, binary copper oxides, binary tin chalcogenides, binary tin oxides, binary zinc chalcogenides, ZnO, and CTS-Se. In some embodiments, the composition further comprises CuS, Cu$_2$S, ZnS, and SnS$_2$. In some embodiments, a molar ratio of copper to zinc to tin is about 2:1:1 of the overall composition. In some embodiments, a molar ratio of copper to (zinc plus tin) is less than one, and a molar ratio of zinc to tin is greater than one. In other embodiments, the heated layers comprise CZTS-Se wherein the Cu/Zn ratio of the kesterite is greater than about 3.1. In yet other embodiments, the heated layers comprise CZTS-Se wherein the Cu/Zn ratio of the kesterite is less than about 1.6.

The inks described above can be used to form CTS-Se or CZTS-Se layers on a substrate. Typically, the ink is coated onto the substrate by conventional means and then dried by applying a vacuum, by evaporation or by heating at a temperature from 80-350° C. Suitable substrates include metal foils, plastics, polymers, metalized plastics, glass, solar glass, low-iron glass, green glass, soda-lime glass, steel, stainless steel, aluminum, ceramics, metal plates, metalized ceramic plates, and metalized polymer plates.

For some inks, it has been found that CZTS-Se is formed during this heating step, with XAS analysis indicating the presence of kesterite.

More typically, the dried, coated substrate is annealed by heating the substrate at about 350° C. to about 800° C. The annealing step can be carried out under an inert atmosphere, provided that the ratio of the total number of moles of the chalcogen, chalcogen compound, sulfur-, and selenium-based organic ligands, and tin-sulfides and selenides to the total number of moles of the copper, tin and zinc complexes is at least about 1. Alternatively, the annealing step can be carried out in an atmosphere comprising an inert gas and reactive component selected from the group consisting of: selenium vapor, sulfur vapor, hydrogen, hydrogen sulfide, hydrogen selenide, and mixtures thereof. Typically, at least a portion of the chalcogen can be exchanged (e.g., S can be replaced by Se) by conducting the annealing step in the presence of selenium vapor or hydrogen selenide.

It has been found that CTS-Se and/or CZTS-Se can be formed in high yield during the annealing step, as determined by XRD or XAS. In some embodiments, annealed films consist essentially of CTS-Se or CZTS-Se, according to XRD analysis.

CZTS-Se can serve as the absorber layer in a photovoltaic cell. A CZTS-Se-based photovoltaic cell can be made by forming the CZTS-Se layer on a photovoltaic substrate (e.g., Mo-coated SLG) and then depositing a buffer layer, a transparent top contact layer, electrode pads, and an antireflective layer in sequence onto the annealed CZTS layer. Except for the absorber layer, the same materials and processes used to assemble a CIGS-based photovoltaic cell can be used to assemble a CZTS-Se-based photovoltaic cell.

EXAMPLES

General

Materials. All reagents were purchased from Aldrich (Milwaukee, Wis.), Alfa Aesar (Ward Hill, Mass.), TCI (Portland, Oreg.), or Gelest (Morrisville, Pa.). Solid reagents were used without further purification. Liquid reagents that were not packaged under an inert atmosphere were degassed by bubbling argon through the liquid for 1 hr. Anhydrous solvents were used for the preparation of all formulations and for all cleaning procedures carried out within the drybox. Solvents were either purchased as anhydrous from Aldrich or Alfa Aesar, or purified by standard methods (e.g., Pangborn, A. G., et. al. *Organometallics,* 1996, 15, 1518-1520) and then stored in the drybox over activated molecular sieves.

Formulation and Coating Preparations. Substrates (SLG slides) were cleaned sequentially with aqua regia, Miilipore® water and isopropanol, dried at 110° C., and coated on the non-float surface of the SLG substrate. All formulations and coatings were prepared in a nitrogen-purged drybox. Vials containing formulations were heated and stirred on a magnetic hotplate/stirrer. Coatings were dried in the drybox.

Details of X-Ray Analysis.

XAS Analysis. XANES spectroscopy at the Cu, Zn and Sn K-edges were carried out at the Advanced Photon Source at the Argonne National Laboratory. Data were collected in fluorescence geometry at beamline 5BMD, DND-CAT. Thin film samples were presented to the incident x-ray beam as made. An Oxford spectroscopy-grade ion chamber was used to determine the X-ray incident intensity ($I_0$). The $I_0$ detector was filled with 570 Torr of $N_2$ and 20 Torr of Ar. The fluorescence detector was a Lytle Cell filled with Xe installed perpendicular to the beam propagation direction. Data were collected from 8879 eV to 9954 eV for the Cu edge. The high final energy was used in order to capture a portion of the Zn edge in the same data set, to allow edge step ratio determination as an estimate of Cu:Zn ratio in the film. The Zn edge data were collected over the range 9557 eV to 10,404 eV. Sn edge data covered the range of 29,000 eV to 29,750 eV. The data energy scales were calibrated based on data from metal reference foils collected prior to sample data collection. A second order background was subtracted and the spectra were normalized. Data from several Cu, Zn and Sn sulfide and oxide standards ($Cu_2ZnSnS_4$, $Cu_2SnS_3$, CuS, $Cu_2S$, CuO, $Cu_2O$, ZnS, ZnO, SnS, SnO and $SnO_2$) were obtained under the same conditions. Non-linear least squares fitting of a linear combination of the appropriate standards to the spectra obtained from the samples yielded the phase distribution for each element.

XRD Analysis. Powder X-ray diffraction was used for the identification of crystalline phases. Data were obtained with a Philips X'PERT automated powder diffractometer, Model 3040. The diffractometer was equipped with automatic variable anti-scatter and divergence slits, X'Celerator RTMS detector, and Ni filter. The radiation was CuK(alpha) (45 kV, 40 mA). Data were collected at room temperature from 4 to 120°. 2-theta; using a continuous scan with an equivalent step size of 0.02°; and a count time of from 80 sec to 240 sec per step in theta-theta geometry. Thin film samples were presented to the X-ray beam as made. MDI/Jade software version 9.1 was used with the International Committee for Diffraction Data database PDF4+ 2008 for phase identification and data analysis.

Identification of CZTS with Small Coherent Domain Size. Comparison of XRD and XAS data can identify films containing nanoscale domains of $Cu_2ZnSnS_4$, kesterite, in which the coherent domain size (d) is 2-30 nm. Detection of kesterite crystalline material at this length scale by x-ray diffraction is difficult due to diffraction peak broadening effects, particularly on the weak lines required to differentiate kesterite from the common impurity phase sphalerite (ZnS). However, x-ray absorption spectroscopy (XAS) is not limited by the size of crystalline domains over which a defect-free, coherent structure may exist. Allowing the interpretation of x-ray diffraction peaks to be guided by the XAS, peak broadening in the diffraction patterns suggests a 30 nm upper limit on domain size. At least two unit cells of kesterite would need to be present in a domain in order for the local environment of at least some of the atoms to resemble that of bulk crystalline kesterite, and so give rise to the appropriate spectrum. This puts a lower limit of 2 nm on the domain size.

Identification of CZTS-Se Kesterite with Atypical Stoichiometries. In the case of XAS, one obtains the fraction of Cu atoms and Zn atoms in the kesterite phase. This, along with a knowledge of overall Cu:Zn ratio, which is determined as described above, allows for determination of the ratio of Cu to Zn in the kesterite phase. This is clearly distinguished from a mixture of separate sulfide phases producing the same elemental ratios in aggregate.

Example 1

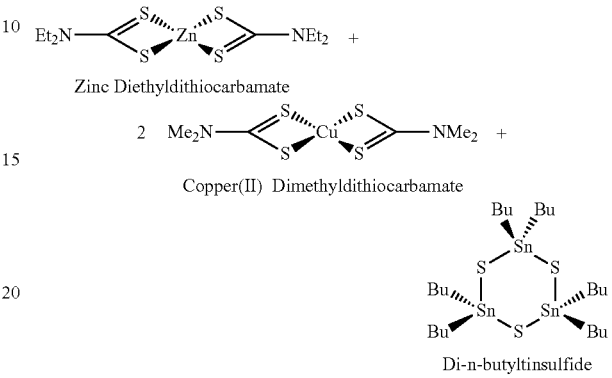

Zinc Diethyldithiocarbamate

Copper(II) Dimethyldithiocarbamate

Di-n-butyltinsulfide

Zinc diethyldithiocarbamate (0.5919 g, 1.635 mmol), copper(II) dimethyldithiocarbamate (0.9930 g, 3.267 mmol), and di-n-butyltinsulfide (0.4506 g, 1.701 mmol) were placed in a 40 mL amber vial equipped with a stir bar. 4-t-Butylpyridine (4.4144 g) was added, and the resulting mixture was stirred well. Next, 0.0520 g (1.621 mmol) of elemental sulfur was added. The reaction mixture was stirred for ~12 hr at room temperature and then ~40 hr at a first heating temperature of 105° C. Next, the reaction mixture was stirred for ~8 hr at a second heating temperature of 190° C. SLG coated substrate 1A was produced via drop-coating according to the following procedure: While being maintained at 105° C. with stirring, a small portion of the formulation was drawn into a pipette and then spread uniformly onto the substrate, which was also heated to 105° C. The coating on the SLG slide was then dried in the drybox by raising the temperature of the hotplate from 105° C. to 170° C. for 0.5 h.

This procedure was repeated with the exception that the coated substrate was dried at 210° C. for 2 hr to produce coated substrate 1B. This procedure was also repeated with the exceptions that 2-aminopyridine was used as the solvent and a treated SLG slide was used as the substrate to produce coated substrate 1C.

Analysis of coated substrates 1A, 1B and 1C by XAS confirmed the presence of CZTS with high Cu/Zn for 1A (Cu/Zn in kesterite=6.45 for 1A) and low Cu/Zn for 1B and 1C (Cu/Zn in kesterite=1.06 for 1B and 1.27 for 1C).

Example 2

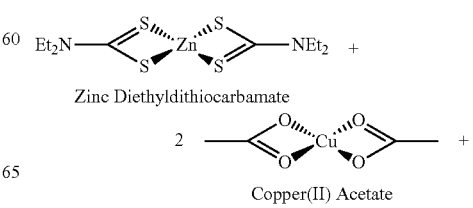

Zinc Diethyldithiocarbamate

Copper(II) Acetate

-continued

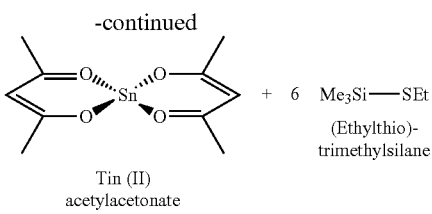

Tin (II) acetylacetonate

+ 6 Me₃Si—SEt (Ethylthio)-
trimethylsilane

In the drybox, zinc diethyldithiocarbamate (0.842 mmol), copper(II) acetate (1.58 mmol), and tin(II) acetylacetonate (0.846 mmol) were placed in a 20 mL vial equipped with a stir bar. 2-Aminopyridine (1.0058 g) was added, followed by 5.05 mmol of (ethylthio)trimethylsilane and 0.814 mmol of sulfur. The reaction mixture was stirred for ~40 hr at a first heating temperature of 105° C. Next, the reaction mixture was stirred for ~8 hr at a second heating temperature of 190° C. A treated glass slide was coated via drop-coating to produce coated substrate 2A in a manner similar to described above in Example 1, with drying at 170° C. for ~0.5 h.

This procedure was repeated with the exception that the 3-aminopyridine was used as the solvent to produce coated substrate 2B. Analysis of coated substrates 2A and 2B by XAS confirmed the presence of CZTS with low Cu/Zn for 2A and 2B (Cu/Zn in kesterite=1.06 for 2A and 1.10 for 2B).

Example 3

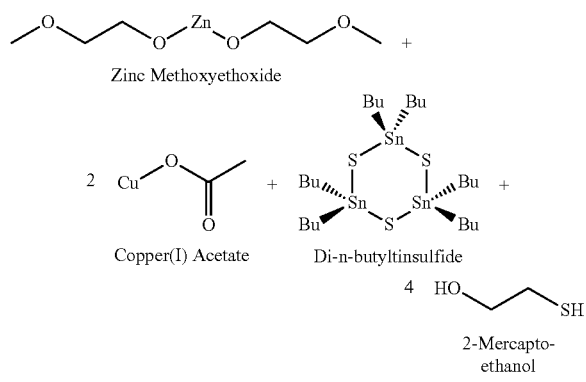

Zinc Methoxyethoxide

Copper(I) Acetate    Di-n-butyltinsulfide

4 HO\_\_\_SH

2-Mercapto-
ethanol

Zinc methoxyethoxide (1.638 mmol), copper(I) acetate (3.263 mmol), di-n-butyltinsulfide (1.631 mmol), and 2-mercaptoethanol (6.885 mmol) were placed together in a 40 mL amber vial equipped with a stir bar. 4-t-Butylpyridine (1.857 g) was added, and the resulting mixture was stirred well. Next, 1.634 mmol of elemental sulfur was added. The reaction mixture was stirred for ~12 hr at room temperature and then ~40 hr at 105° C. Next, the reaction mixture was stirred ~16 hr at 190° C. A SLG coated substrate 3A was produced via drop-coating according to the procedure of Example 1, with drying at 250° C. for 0.5 hr.

This procedure was repeated using 2-aminopyridine as the solvent with the reaction mixture stirring ~8 hr at a second heating temperature of 170° C., to produce coated substrate 3B. This procedure was repeated using 4-t-butylpyridine as the solvent with the reaction mixture stirring ~8 hr at a second heating temperature of 160° C., to produce coated substrate 3C. Coatings 3B and 3C were both dried at 170° C. for 0.5 hr and then annealed at 550° C. for 0.5 hr.

Analysis of coated substrates 3A, 3B and 3C by XAS confirmed the presence of CZTS with low Cu/Zn for 3A (Cu/Zn in kesterite=1.43 for 3A), high Cu/Zn for 3B (Cu/Zn in kesterite=2.70 for 3B) and low Cu/Zn for 3C (Cu/Zn in kesterite=1.45 for 3C).

Example 4

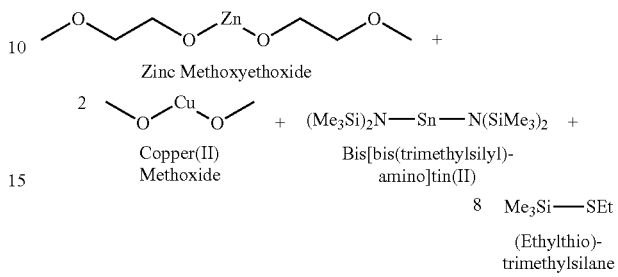

Zinc Methoxyethoxide

Copper(II)        Bis[bis(trimethylsilyl)-
Methoxide         amino]tin(II)

8 Me₃Si—SEt (Ethylthio)-
trimethylsilane

Following the procedure of Example 1, a formulation was prepared using 0.1768 g (0.820 mmol) of zinc methoxyethoxide, 0.2047 g (1.630 mmol) of copper(II) methoxide, 0.4004 g (0.911 mmol) bis[bis(trimethysilyl)amino]tin(II), 0.8990 g (6.692 mmol) of ethylthiotrimethylsilane, 0.0259 g (0.808 mmol) of elemental sulfur, and 0.4700 g of 3,5-lutidine with a second heating temperature of 165° C. The coating was dried in the drybox at 170° C. for 0.5 h. Analysis of the coated substrate by XAS confirmed the presence of CZTS with low Cu/Zn (Cu/Zn in kesterite=1.18).

Example 5

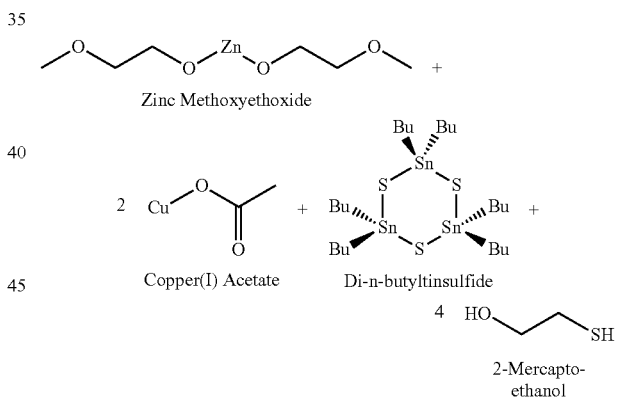

Zinc Methoxyethoxide

Copper(I) Acetate    Di-n-butyltinsulfide

4 HO\_\_\_SH

2-Mercapto-
ethanol

Zinc methoxyethoxide (1.638 mmol), copper(I) acetate (3.263 mmol), di-n-butyltinsulfide (1.631 mmol), and 2-mercaptoethanol (6.885 mmol) were placed together in a 40 mL amber vial equipped with a stir bar. 4-t-Butylpyridine (1.857 g) was added, and the resulting mixture was stirred well. Next, 1.634 mmol of elemental sulfur was added. The reaction mixture was stirred for ~12 hr at room temperature and then ~40 hr at 105° C. Next, the reaction mixture was stirred ~16 hr at 190° C. A SLG coated substrate 5A was produced via drop-coating according to the following procedure: While being maintained at 105° C. with stirring, a small portion of the formulation was drawn into a pipette and then spread uniformly onto the substrate, which was also heated to 105° C. The coating on the SLG slide was then dried in the drybox by raising the temperature of the hotplate from 105° C. to 250° C. for 0.5 h.

This procedure was repeated using 3.714 g of 4-t-butylpyridine with ~9 hr of heating during the second heat at 190° C. to produce coated substrate 5B, and using 3.714 g of 4-t-butylpyridine with ~11 hr of heating during the second heat at 190° C. to produce coated substrate 5C.

Analysis of coated substrates 5A, 5B and 5C by XRD indicated that CZTS may be present in these samples in at most trace amounts. However, both Cu and Zn XAS spectra (Table 5-1) indicated the presence of significant quantities of CZTS in all three coatings. CuS, $Cu_2S$ and ZnS comprised the other copper- and zinc-containing species, with only traces of ZnO present. Sn XAS analysis indicated Sn(IV) sulfides (e.g., CZTS and $SnS_2$) as the predominate tin-containing compounds, comprising greater than 89% of all tin-containing compounds in all three coatings. Comparison of the XRD and XAS data indicates that this route produces films containing nanoscale domains of CZTS kesterite, in which the coherent domain size (d) is 2-30 nm. The Cu/Zn ratio in kesterite of coating 5A was 1.43.

TABLE 5-1

Cu and Zn XAS analysis.

| | Cu | | | Zn | | |
|---|---|---|---|---|---|---|
| Ex | CZTS | CuS | $Cu_2S$ | CZTS | ZnS | ZnO |
| 5A | 0.27 | 0.52 | 0.20 | 0.47 | 0.49 | 0.04 |
| 5B | 0.34 | 0.45 | 0.21 | 0.28 | 0.69 | 0.03 |
| 5C | 0.38 | 0.40 | 0.22 | 0.27 | 0.69 | 0.04 |

What is claimed is:

1. A composition comprising a compound having a kesterite structure, wherein the Cu/Zn ratio of the kesterite is greater than about 3.1.

2. The composition of claim 1, further comprising one or more copper-, tin-, or zinc-containing compounds selected from the group consisting of binary copper chalcogenides, binary copper oxides, binary tin chalcogenides, binary tin oxides, binary zinc chalcogenides, ZnO, and CTS-Se.

3. The composition of claim 2, wherein the molar ratio of copper to zinc to tin of the overall composition is about 2:1:1.

4. The composition of claim 2, wherein the molar ratio of copper to (zinc plus tin) of the overall composition is less than one, and the molar ratio of zinc to tin is greater than one.

5. A composition comprising a compound having a kesterite structure, wherein the Cu/Zn ratio of the kesterite is less than about 1.6, wherein the composition further comprises one or more copper-, tin-, or zinc-containing compounds selected from the group consisting of binary copper chalcogenides, binary copper oxides, binary tin chalcogenides, binary tin oxides, binary zinc chalcogenides, ZnO, and CTS-Se.

6. The composition of claim 5, wherein the molar ratio of copper to zinc to tin of the overall composition is about 2:1:1.

7. The composition of claim 5, wherein the molar ratio of copper to (zinc plus tin) of the overall composition is less than one, and the molar ratio of zinc to tin is greater than one.

* * * * *